United States Patent
Goel et al.

(10) Patent No.: US 7,826,241 B2
(45) Date of Patent: Nov. 2, 2010

(54) SEMICONDUCTOR MEMORY DEVICE THAT CAN RELIEVE DEFECTIVE ADDRESS

(75) Inventors: Ankur Goel, Bangalore (IN); Krishman S. Rengarajan, Bangalore (IN); Sahadevan A. Kumaran, Bangalore (IN); Sanjay Kumar Mishra, Bangalore (IN)

(73) Assignee: Elpida Memory, Inc., Chuo-ku, Tokyo (JP)

( * ) Notice: Subject to any disclaimer, the term of this patent is extended or adjusted under 35 U.S.C. 154(b) by 141 days.

(21) Appl. No.: 12/222,809

(22) Filed: Aug. 15, 2008

(65) Prior Publication Data

US 2009/0168478 A1    Jul. 2, 2009

(30) Foreign Application Priority Data

Dec. 28, 2007    (IN) .................... 3142/CHE/2007

(51) Int. Cl.
G11C 15/00    (2006.01)

(52) U.S. Cl. .................... 365/49.1; 365/49.17; 365/200; 365/203

(58) Field of Classification Search .................. 365/200, 365/49.1, 49.17, 203
See application file for complete search history.

(56) References Cited

U.S. PATENT DOCUMENTS

| | | | |
|---|---|---|---|
| 5,267,213 A | 11/1993 | Sung et al. | |
| 5,930,194 A * | 7/1999 | Yamagata et al. | 365/230.03 |
| 6,006,313 A | 12/1999 | Fukumoto | |
| 6,614,685 B2 * | 9/2003 | Wong | 365/185.11 |
| 6,895,537 B2 | 5/2005 | Kawagoe et al. | |
| 7,525,828 B2 * | 4/2009 | Yabe | 365/49.1 |
| 2001/0056557 A1 | 12/2001 | Kawagoe et al. | |

FOREIGN PATENT DOCUMENTS

| | | |
|---|---|---|
| JP | 09-007390 | 10/1997 |
| JP | 2001-358296 | 12/2001 |

* cited by examiner

*Primary Examiner*—Richard Elms
*Assistant Examiner*—Hien N Nguyen
(74) *Attorney, Agent, or Firm*—McGinn IP Law Group, PLLC

(57) ABSTRACT

A pre-decoded address is generated at a high speed in a semiconductor memory device. The device comprises a pre-decoder (210) for generating a first pre-decoded address (PDA1) by pre-decoding the input address (ADD), a CAM circuit (220) for activating the match signal (MT) by responding to the indication of a defective memory cell by the input address (ADD), a ROM circuit (230) for outputting a second pre-decoded address (PDA2) and an enable signal (ES) in response to the activation of the match signal (MT), and a multiplexer (240) for selecting either the first or second pre-decoded address (PDA1 or PDA2) on the basis of the enable signal (ES). According to the present invention, there is no need to use a circuit with numerous stages as there is in substituted logic; accordingly, pre-decoded addresses can be generated at a high speed.

14 Claims, 8 Drawing Sheets

SEMICONDUCTOR MEMORY DEVICE THAT CAN RELIEVE DEFECTIVE ADDRESS

TECHNICAL FIELD

The present invention relates to a semiconductor memory device, and more particularly relates to a semiconductor memory device that can relieve defective addresses by replacing defective memory cells into redundant memory cells.

BACKGROUND OF THE INVENTION

The storage capacity of semiconductor memory devices as represented by DRAM (dynamic random access memories) has increased each year as a result of the progress made in microfabrication techniques. However, as miniaturization has progressed, there has also been an increase in the number of defective memory cells contained in a single chip. Such defective memory cells are ordinarily replaced into redundant memory cells; in this way, defective addresses are relieved.

Generally, defective addresses are stored in fuse circuits that include a plurality of program fuses. In a fuse circuit, a match signal is activated when access to these addresses is requested. When the match signal is activated, the pre-decoder generates a signal in which a substitute address is pre-decoded rather than the input address. Redundant memory cells, rather than defective memory cells, are thereby accessed, and defective addresses are accordingly relieved.

FIG. 8 is a block diagram showing the main parts of a conventional semiconductor memory device.

The semiconductor memory device shown in FIG. 8 includes a memory cell array 10, and an access control circuit 20 for accessing the memory cell array 10. The access control circuit 20 includes a pre-decoder 21 which pre-decodes the input address ADD, a driver 22 which receives the output of the pre-decoder 21 and selects specified memory cells, and a fuse circuit 23 which stores the addresses of defective memory cells.

In cases in which the input address ADD is not the address of a defective memory cell, i.e., in cases in which this address is a normal address, the pre-decoder 21 pre-decodes the input address ADD directly, and supplies the output to the driver 22. On the other hand, in cases in which the input address ADD is the address of a defective memory cell, i.e., if this address is a defective address, the fuse circuit 23 activates a match signal 23a. The match signal 23a is input to the pre-decoder 21. When the match signal 23a is activated, the pre-decoder 21 generates a pre-decoded address that is substituted using internal substitution logic 21a.

Furthermore, regarding the storage of addresses, the techniques described in Japanese Patent Application Laid-Open Nos. 2001-358296 and H9-7390, and U.S. Pat. No. 5,267,213 are known.

However, in order to detect a defective address using the fuse circuit 23 and generate a pre-decoded address that is substituted using the pre-decoder 21, a specified operating time is necessary. In particular, since the substitution logic 21a contained in the pre-decoder 21 includes numerous gate circuits, it takes a relatively long time for signals to pass through. Accordingly, the access speed is limited mainly by the pre-decoder 21, and this is an obstacle to high-speed access.

SUMMARY OF THE INVENTION

It is therefore an object of the present invention to provide a semiconductor memory device having an improved access speed.

Another object of the present invention is to provide a semiconductor memory device that can generate pre-decoded addresses at a high speed.

The above and other objects of the present invention can be accomplished by a semiconductor memory device comprising: a memory cell array including a plurality of memory cells that can be accessed by inputting an input address; a pre-decoder that pre-decodes the input address to generate a first pre-decoded address; a CAM circuit that activates a match signal in response to the input address indicating a defective memory cell; a ROM circuit that outputs a second pre-decoded address and an enable signal in response to an activation of the match signal; and a multiplexer for selecting either the first pre-decoded address or the second pre-decoded address based on the enable signal.

According to the present invention, since the second pre-decoded address is stored in a ROM circuit, when the defective address is detected by the CAM circuit, it is sufficient merely to select the second pre-decoded address using a multiplexer. As a result, there is no need to use circuits with numerous stages as in substitution logic; accordingly, high-speed access is possible.

In a preferred embodiment of the present invention, the CAM circuit includes a match line that outputs match signal, a plurality of CAM cells each corresponding to an associated one bit of the input address, and a pre-charging circuit that pre-charges the match line. It is preferable that the CAM cells includes a nonvolatile memory element and a discharge circuit that discharges the match line in response to a logical value stored in the nonvolatile element and a logical value of a corresponding bit of the input address being different.

In a preferred embodiment of the present invention, the ROM circuit includes a plurality of ROM cells each corresponding to an associated one bit of the second pre-decoded address, and first and second bit lines which are connected to the ROM cells. It is preferable that each ROM cell has a first transistor which is connected between the first bit line and either the first or second power supply, and in which the match signal is supplied to the gate electrode, a second transistor which is connected between the second bit line and the other power supply, i.e., first or second power supply, and which has a match signal supplied to the gate electrode, and third and fourth transistors which are cross-coupled with the first and second bit lines. The conductivity type of the first and second transistors is preferably different from the conductivity type of the third and fourth transistors.

According to the present invention, there is no need to use a circuit with numerous stages as there is in the case of substituted logic. Consequently, the speed at which a memory cell array is accessed can be increased.

BRIEF DESCRIPTION OF THE DRAWINGS

The above and other objects, features and advantages of this invention will become more apparent by reference to the following detailed description of the invention taken in conjunction with the accompanying drawings, wherein.

DETAILED DESCRIPTION OF THE EMBODIMENTS

Preferred embodiments of the present invention will now be explained in detail with reference to the drawings.

Figure 1:
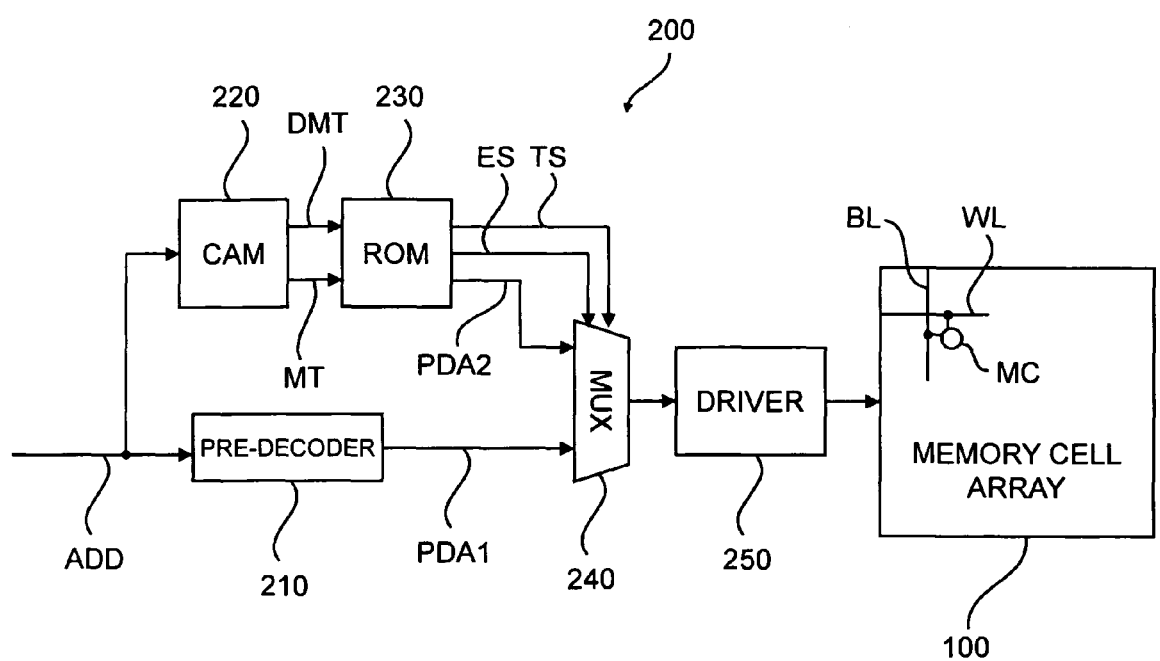
FIG. 1 is a block diagram showing the main parts of a semiconductor memory device according to a preferred embodiment of the present invention.

FIG. 1 is a block diagram showing the main parts of a semiconductor memory device according to a preferred embodiment of the present invention.

As is shown in FIG. 1, the semiconductor memory device of the present embodiment includes a memory cell array 100, and an access control circuit 200 for accessing the memory cell array 100. The memory cell array 100 has a plurality of memory cells MC that can be accessed in accordance with an input-address ADD. The memory cells MC are disposed at the intersection points of word lines WL and bit lines BL. When the corresponding word lines WL are activated, these memory cells MC are connected to the corresponding bit lines BL. Although there are no particular restrictions, DRAM cells can be used as the memory cells MC.

Figure 2:
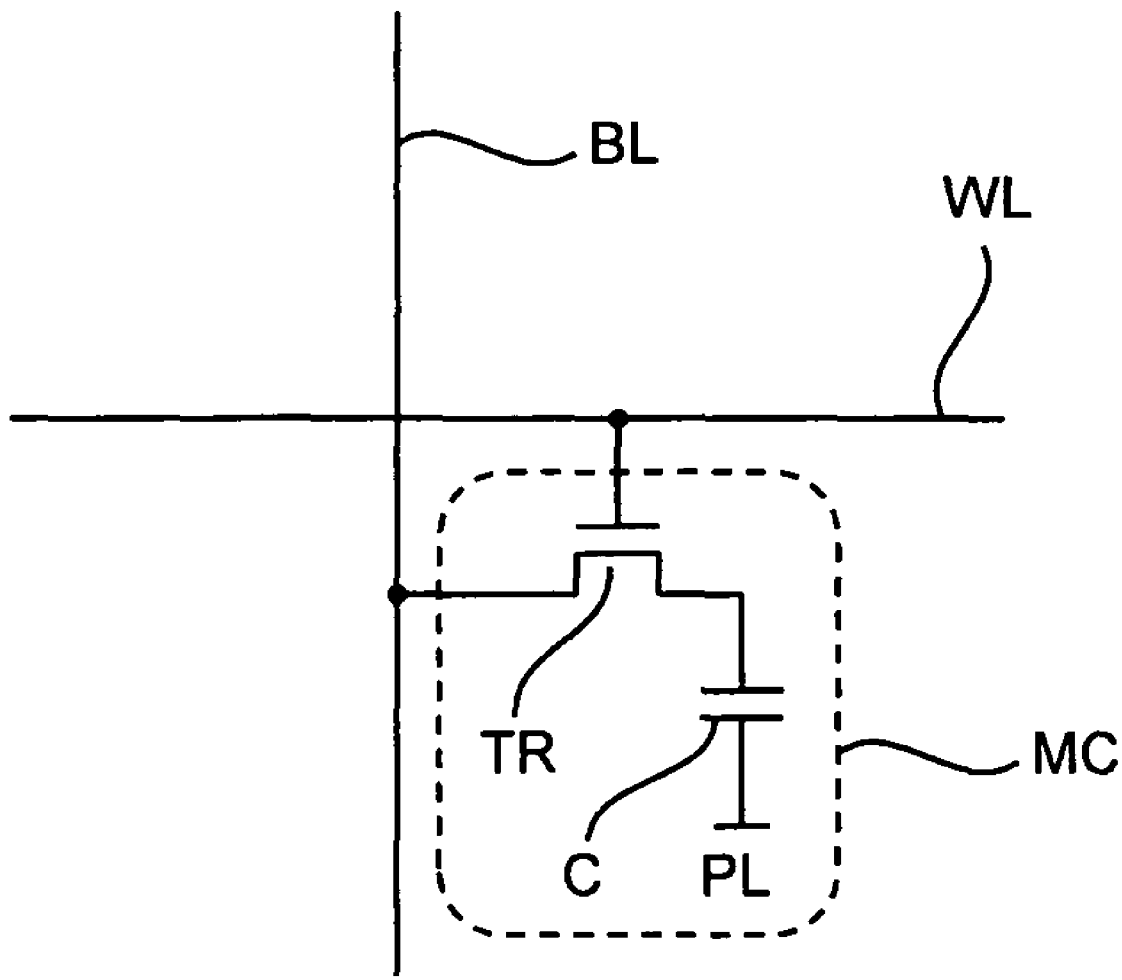
FIG. 2 is a circuit diagram of a memory cell.

As is shown in FIG. 2, in cases in which the memory cells MC are DRAM cells, the memory cells MC are composed of cell transistors TR and cell capacitors C. The cell transistors TR and cell capacitors C are connected in series between the corresponding bit lines BL and plate wiring PL, and the gates of the cell transistors TR are connected to the corresponding word lines WL. As a result, when the word lines WL are activated, the cell transistors TR are switched on, and the bit lines BL and cell capacitors C are connected.

The memory cells MC contained in the memory cell array 100 are classified as ordinary cells and redundant cells. In cases in which there are defects in the ordinary cells, the defective ordinary cells are replaced with redundant cells; as a result, these defective addresses are relieved. This replacement may be performed in memory cell units, word line units, or bit line units. Furthermore, in cases in which the word lines are arranged in a hierarchy in main word lines and sub-word lines, replacements may be made in main word line units or sub-word line units.

Returning back to FIG. 1, the access control circuit 200 includes a pre-decoder 210, a CAM circuit 220, a ROM circuit 230, a multiplexer 240, and a driver 250.

The pre-decoder 210 is a circuit that generates a first pre-decoded address PDA1 by pre-decoding the input address ADD. The pre-decoder 210 performs pre-decoding regardless of whether or not the input address ADD is a defective address, i.e., an address corresponding to a memory cell that has defects. The first pre-decoded address PDA1 is an address for an ordinary cell, and is supplied to the multiplexer 240.

The CAM circuit 220 is a circuit that stores defective addresses. In cases in which the input address ADD is a defective address, the CAM circuit 220 activates the match signal MT. Furthermore, when an input address ADD is supplied, regardless of whether or not this input address ADD is a defective address, the CAM circuit 220 activates a dummy match signal DMT. The dummy match signal DMT is used as a timing signal for the ROM circuit 230.

The ROM circuit 230 is a circuit that stores substitute addresses. The ROM circuit 230 outputs a second pre-decoded address PDA2 when a match signal MT is activated. The second pre-decoded address PDA2 is an address corresponding to a redundant cell, and is supplied to the multiplexer 240. Furthermore, the ROM circuit 230 generates an enable signal ES and a timing signal TS, and supplies these signals to the multiplexer 240. The enable signal ES is a signal that performs activation in cases in which a second pre-decoded address PDA2 is generated by the activation of the match signal MT. Furthermore, the timing signal TS is a signal that is activated in response to the dummy match signal DMT, and is a signal that controls the operating timing of the multiplexer 240.

The multiplexer 240 is a circuit that selects either the first pre-decoded address PDA1 or the second pre-decoded address PDA2, and supplies the selected address to the driver 250. The selection of the pre-decoded address by the multiplexer 240 is performed in synchronization with the timing signal TS on the basis of the enable signal ES. The output of the multiplexer 240 is supplied to the driver 250, and complete decoding of the address is performed. As a result, a specified memory cell MC is selected.

Figure 3:
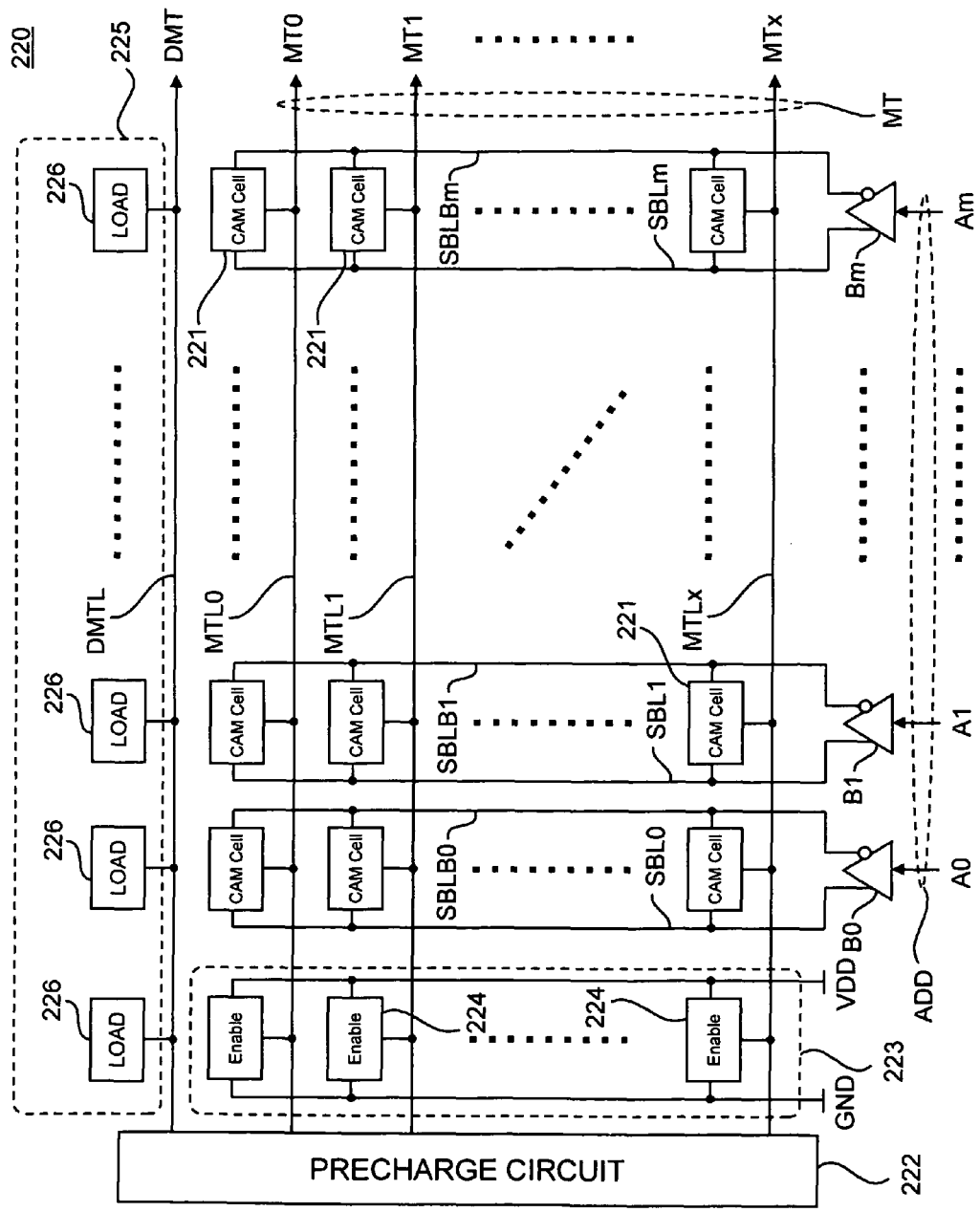
FIG. 3 is a circuit diagram of a CAM circuit.

FIG. 3 is a circuit diagram of the CAM circuit 220.

As is shown in FIG. 3, the CAM circuit 220 includes a plurality of match lines MTL0 to MTLx, a dummy match line DMTL, and a plurality of search bit line pairs SBL0/SBLB0 to SBLm/SBLBm.

The match lines MTL0 to MTLx are wirings that output respective match signals MT0 to MTx. The match signals MT0 to MTx are signals that constitute the match signals MT shown in FIG. 1, and are activated in cases in which respectively corresponding defective addresses are detected. Accordingly, in the present example, x+1 defective addresses can be stored.

The search bit line pairs SBL0/SBLB0 to SBLm/SBLBm respectively correspond to the respective bits of the input address ADD. In the present embodiment, the input address ADD is composed of the m+1 bits comprising A0 to Am, and the search bit line pairs SBL0/SBLB0 to SBLm/SBLBm are respectively assigned to these respective bits. The respective bits A0 to Am of the input address ADD are used as complementary signals by the respectively corresponding buffers B0 to Bm, and these complementary signals are supplied to the corresponding search bit lines.

As is shown in FIG. 3, CAM cells 221 are disposed at the intersection points between the match lines MTL0 to MTLx and the search bit line pairs SBL0/SBLB0 to SBLm/SBLBm. The CAM cells 221 are circuits that each store 1 bit of data in a nonvolatile manner, and that discharge the corresponding match lines in cases in which there is no match between the data provided via the corresponding search bit line pairs and the stored data. Conversely, no discharge operation is performed in cases in which there is a match between these two types of data.

In the initial stage, the match lines MTL0 to MTLx and dummy match line DMTL are pre-charged by the pre-charging circuit 222. Accordingly, the match line can maintain a pre-charged potential only in cases in which a match among all of the CAM cells 221 connected to the same match line is detected. On the other hand, in cases in which a mismatch is detected in even one of the CAM cells 221 connected to the same match line, this match line is discharged.

Figure 4:
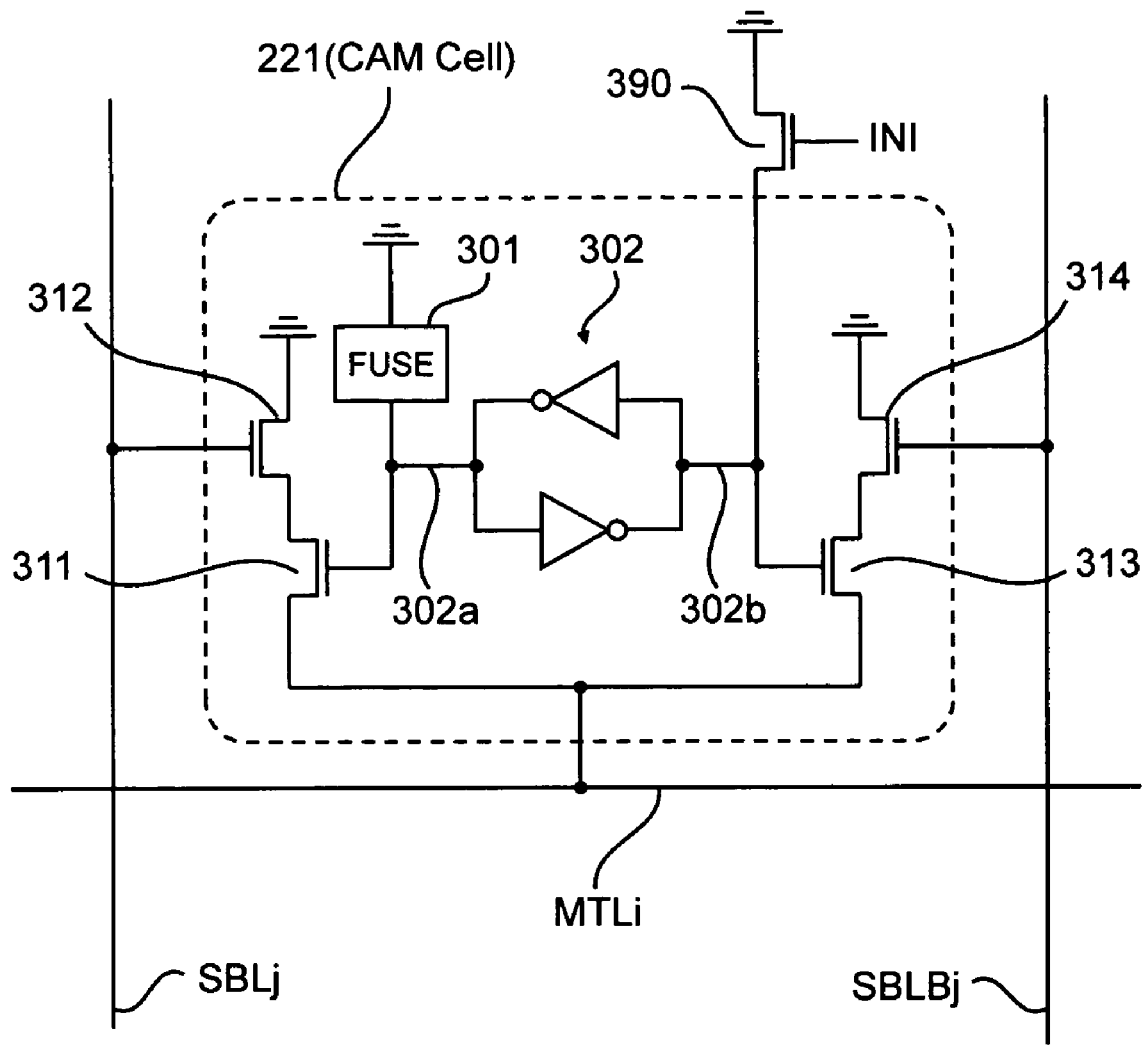
FIG. 4 is a circuit diagram of the CAM cell.

FIG. 4 is a circuit diagram of the CAM cell 221.

As is shown in FIG. 4, the CAM cell 221 includes a fuse element 301, a latch circuit 302 that is connected to the fuse element 301, and transistors 311 to 314. The transistors 311 and 312 and the transistors 313 and 314 are connected in series between the corresponding match line MTLi (I=0~x) and ground GND. The ground GND functions as a discharge line that is used to discharge the pre-charged match lines. Accordingly, as long as the match lines can be discharged, a potential other than the ground GND may also be used.

The gate electrode of the transistor 311 is connected to one of the output terminal 302a of the latch circuits 302, and the gate electrode of the transistor 313 is connected to the other output terminal 302*b* of the latch circuit 302. Accordingly, one of these transistors 311 and 313 is switched on, and the other is switched off, in accordance with information held in the latch circuit 302.

Furthermore, the gate electrode of the transistor 312 is connected to the corresponding search bit line SBLj (j=0~m), and the gate electrode of the transistor 314 is connected to the corresponding search bit line SBLBj. Accordingly, one of these transistors 312 and 314 is switched on, and the other is switched off, in accordance with the logical values of the corresponding bits of the input address ADD.

The fuse element 301 is in a conductive state (low-resistance state) in the initial state. Accordingly, in the initial state, the output terminal 302*a* of the latch circuit 302 is connected to the ground GND. Consequently, when the initializing transistor 390 is temporarily switched on by activating the initializing signal INI, the output terminal 302*a* is fixed at a low level, and the output terminal 302*b* is fixed at a high level. On the other hand, when the fuse element 301 is cut off by irradiation with a laser beam or the like, the fuse element 301 is placed in an insulated state (high-resistance state). Consequently, when the initializing transistor 390 is temporarily switched on, the output terminal 302*a* is at a high level, and the output terminal 302*b* is at a low level. The initializing transistor 390 can be used in common for a plurality of CAM cells 221.

In the present embodiment, a state in which the fuse element 301 is not cut off indicates a state in which a logical value of "1" is stored, and a state in which the fuse element 301 is cut off indicates a state in which a logical value of "0" is stored. In cases in which the logical values of corresponding bits of the input address ADD are "1", the search bit line SBLj is at a high level, and the search bit line SBLBj is at a low level. Conversely, in cases in which the logical values of corresponding bits of the input address ADD are "0", the search bit line SBLj is at a low level, and the search bit line SBLBj is at a high level.

Next, the operation of the CAM cells 221 will be described.

First, in cases in which the logical value stored in the fuse element 301 is "1", and the logical value of the corresponding bit of the input address ADD is also "1", the transistors 312 and 313 are switched on, and the transistors 311 and 314 are switched off. As a result, a path that connects the match line MTLi to ground GND is not formed. Accordingly, discharging of the match line MTLi by this CAM cell 221 is not performed.

Similarly, in cases in which the logical value stored in the fuse element 301 is "0", and the logical value of the corresponding bit of the input address ADD is also "0", the transistors 311 and 314 are switched on, and the transistors 312 and 313 are switched off. As a result, a path that connects the match line MTLi to ground GND is not formed. Accordingly, discharging of the match line MTLi by this CAM cell 221 is not performed.

Thus, in cases in which there is a match between the logical value stored in the fuse element 301 and the logical value of the corresponding bit of the input address ADD, the CAM cell 221 does not discharge the corresponding match line MTLi.

On the other hand, in cases in which the logical value stored in the fuse element 301 is "0", and the logical value of the corresponding bit of the input address ADD is "1", the transistors 311 and 312 are switched on, and the transistors 313 and 314 are switched off. As a result, the match line MTLi is discharged by the transistors 311 and 312 connected in series.

Similarly, in cases in which the logical value stored in the fuse element 301 is "1", and the logical value of the corresponding bit of the input address ADD is "0", the transistors 313 and 314 are switched on, and the transistors 311 and 312 are switched off. As a result, the match line MTLi is discharged by the transistors 313 and 314 connected in series.

Thus, the CAM cells 221 discharge the match lines MTLi by connecting the corresponding match lines MTLi and the ground GND in cases in which the logical values stored in the fuse element 301 do not match the logical values of the corresponding bits of the input address ADD.

The above has been a description of the circuit construction and operation of the CAM cells 221. As is shown in FIG. 3, such CAM cells 221 are respectively disposed at the intersection points between the match lines MTL0 to MTLx and search bit line pairs SBL0/SBLBo to SBLm/SBLBm. Accordingly, when there is a match among all of the logical values stored in the fuse element 301 and logical values of the respective bits of the input address ADD, the respective match lines MTLi maintain a pre-charged potential, wherein the match signal MTi is activated. Conversely, if the logical values stored in the fuse element 301 and the logical values of the respective bits of the input address ADD differ by even a single bit, these match lines MTLi are discharged. This state is a state in which the match signals Mti are inactivated.

As a result of this construction, the CAM circuit 220 shown in FIG. 3 can store x+1 defective addresses.

Furthermore, as is shown in FIG. 3, an enable circuit 223 is provided in the CAM circuit 220. The enable circuit 223 is constituted of enable cells 224 which are assigned one each to the match lines MTL0 to MTLx. The circuit configuration of the enable cells 224 is completely identical to that of the CAM cells 221 shown in FIG. 4. In the enable circuit 223, as is shown in FIG. 3, wiring lines corresponding to the search bit lines SBL are fixed to the ground GND, and wiring lines corresponding to the search bit lines SBLB are fixed to the power supply potential VDD.

The enable cells 224 play the role of so-called enable fuses. In other words, when the corresponding match lines are placed in a state of use, programming is performed in the enable cells 224 connected to these match lines. Conversely, in the case of match lines that are not in use, programming is not performed in the enable cells 224 that are connected to these match lines. As a result, since match lines that are not used are discharged by the enable cells 224 regardless of the values of the input address ADD, the match signals MT are not activated. On the other hand, since match lines that are used are not discharged by the enable cells 224, match signals MT can be activated in accordance with the input address ADD.

Also, as is shown in FIG. 3, the CAM circuit 220 further includes a first dummy circuit 225 that is connected to a dummy match line DMTL. The first dummy circuit 225 is composed of m+2 load circuits 226.

The load circuit 226 is a circuit that provides a load capacity that is the same as that of the CAM cells 221 in the case where a match with the dummy match line DMTL is detected. The load circuit 226 does not perform a discharge operation. Accordingly, when a pre-charging operation is performed by the pre-charging circuit 222, the dummy match signal is activated regardless of the value of the input address ADD. Furthermore, as was described above, since the load capacity of the load circuit 226 is set at the same value as that of the CAM cells 221 in cases in which a match is detected, the activation timing of the dummy match signal DMT matches the activation timing of the match signals MT.

As is shown in FIG. 1, the match signals MT and dummy match signal DMT generated in this way are supplied to the ROM circuit 230.

Figure 5:
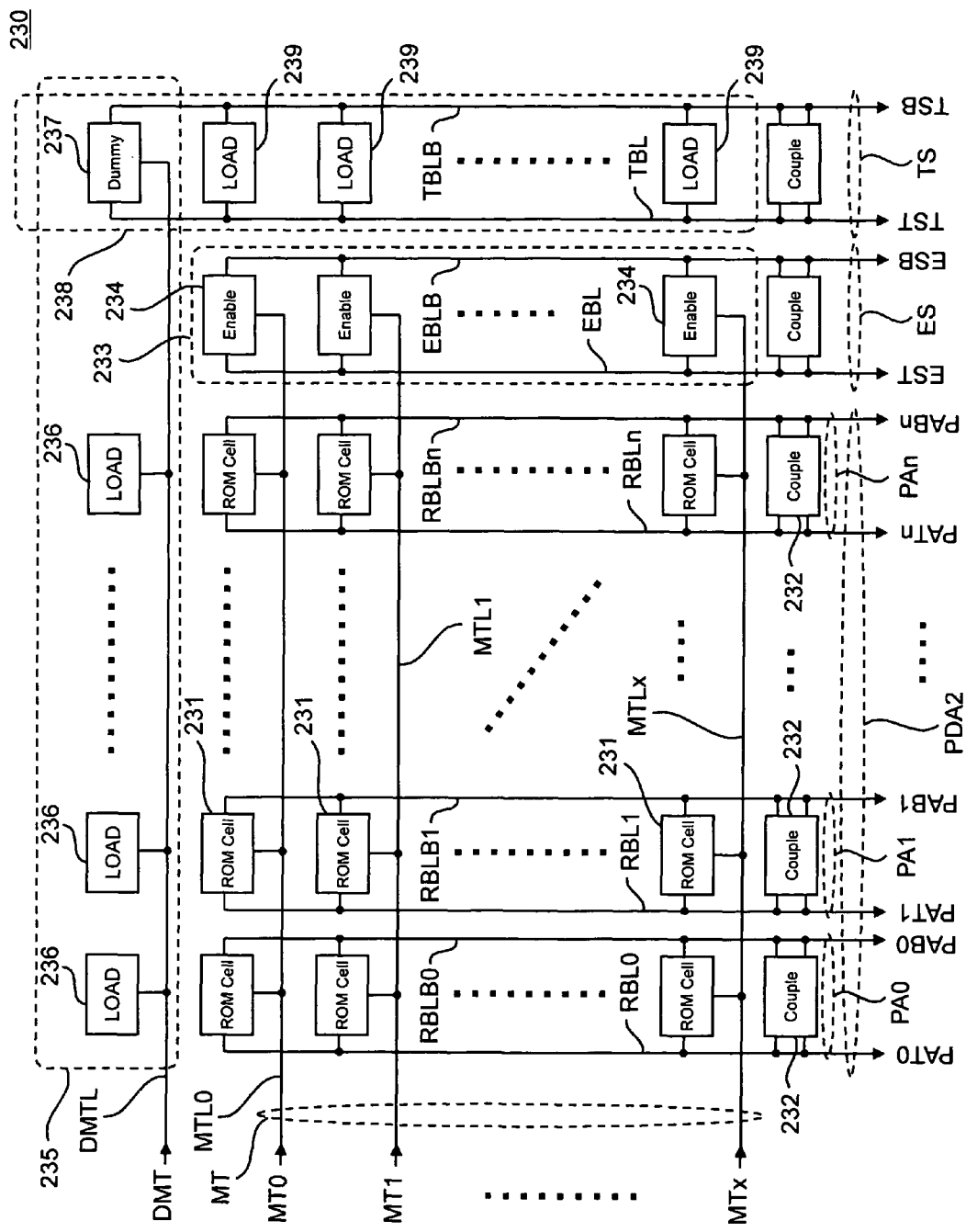
FIG. 5 is a circuit diagram of the ROM circuit.

FIG. 5 is a circuit diagram of the ROM circuit 230.

As is shown in FIG. 5, the ROM circuit 230 includes a plurality of match lines MTL0 to MTLx, a dummy match line DMTL, a plurality of ROM bit line pairs RBL0/RBLBo to RBLn/RBLBn, a pair of enable bit lines EBL/EBLB, and a pair of timing bit lines TBL/TBLB.

The match lines MTL0 to MTLx are the same wiring lines as the match lines MTL0 to MTLx shown in FIG. 3. Furthermore, the dummy match line DMTL is also the same wiring line as the dummy match line DMTL shown in FIG. 3. However, it is not essential that these match lines (dummy match line) be continuous wiring lines; buffers or the like may be interposed therebetween.

The ROM bit line pairs RBL0/RBLB0 to RBLn/RBLBn respectively correspond to the respective bits of the second pre-decoded address PDA2. More specifically, the second pre-decoded address PDA2 is composed of the n+1 bits comprising PA0 to PAn, and the ROM bite line pairs respectively correspond to these respective bits. The bits PA0 to PAn of the second pre-decoded address PDA2 are all complementary signals, and are composed of true signals (T) and bar signals (B). For example, the bit PA0 is composed of the complementary signals PAT0 and PAB0.

As is shown in FIG. 5, ROM cells 231 are disposed at the intersection points between the match lines MTL0 to MTLx and the ROM bit line pairs RBL0/RBLB0 to RBLn/RBLBn. The ROM cells 231 are circuits which each store a single bit of data in a non-volatile manner, and output the stored data to the corresponding ROM bit line pair when the corresponding match line is activated. In the case where the corresponding match lines are inactive, the ROM cells 231 are in a high-impedance state with respect to the corresponding ROM bit line pairs.

Figure 6:
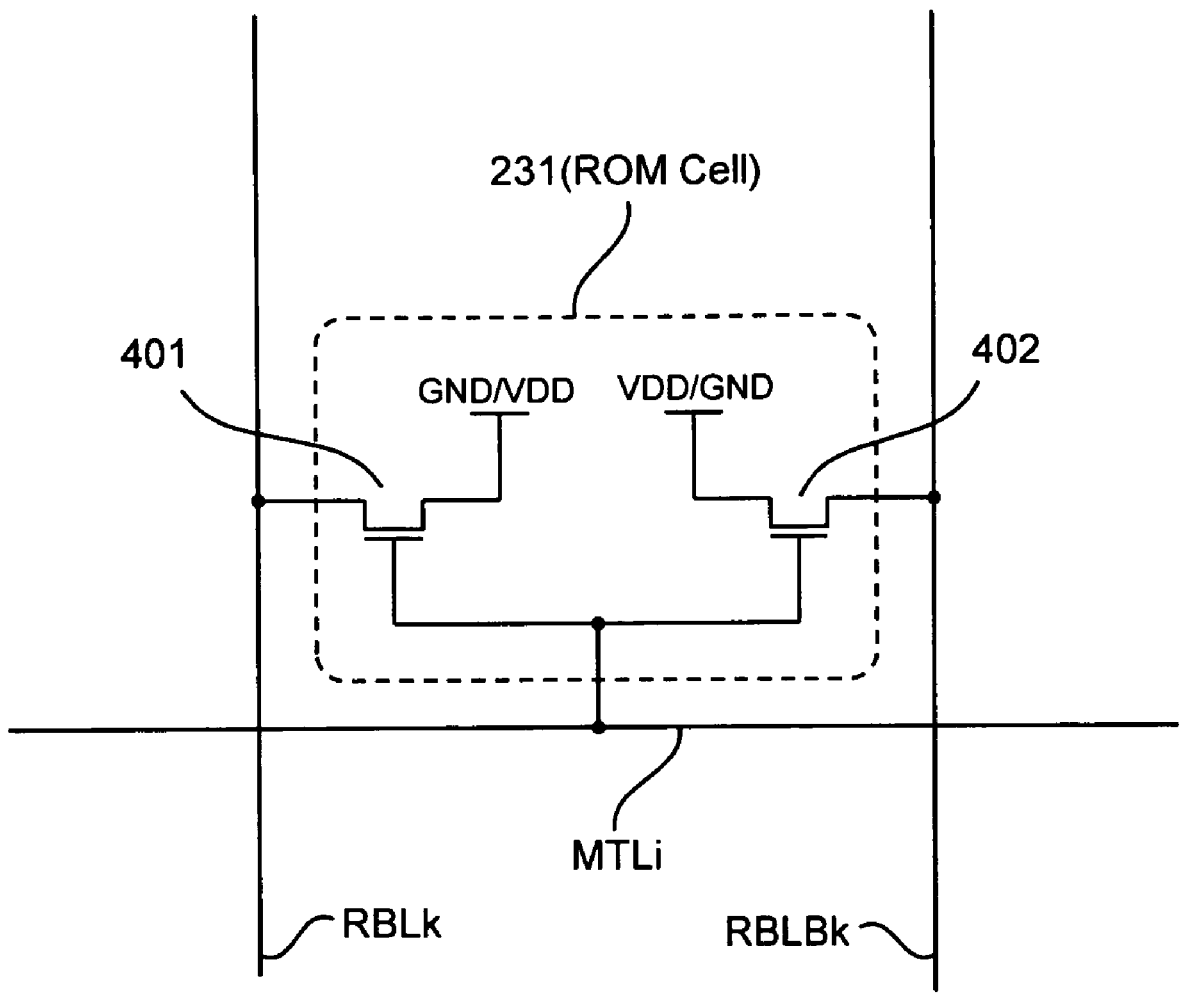
FIG. 6 is a circuit diagram of the ROM cell.

FIG. 6 is a circuit diagram of the ROM cell 231.

As is shown in FIG. 6, each ROM cell 231 is composed of transistors 401 and 402 whose gate electrodes are connected to the corresponding match line MTLi (i=0 to x). The transistors 401 and 402 are both N-channel MOS transistors. One end of the transistor 401 is connected to the corresponding ROM bit line RBLk (k=0 to n), and the other end is connected to either the ground GND or power supply potential VDD. One end of the transistor 402 is connected to the corresponding ROM bit line RBLBk, and the other end is connected to the other of the ground GND and power supply potential VDD.

The selection of whether the transistors 401 and 402 are connected to the ground GND or connected to the power supply potential VDD can be accomplished by the changeover of the photo-mask used during manufacture. As a result of such a construction, when a match line MTLi is activated, the ROM bit line RBLk is driven at either a high level or a low level, and the ROM bit line RBLBk is driven at the other of the two levels, i.e., high level or low level.

However, since the transistors 401 and 402 are N-channel MOS transistors, although one of the pair of ROM bit lines RBLk and RBLBk can be driven substantially completely to the ground GND level, the other of the pair of ROM bit lines RBLk and RBLBk cannot be completely driven to the power supply potential VDD level. More specifically, this other line can be driven only to VDD-Vth, where Vth is the threshold value of the transistors 401 and 402.

In the present embodiment, in order to solve such a problem, a cross-coupled circuit 232 is disposed in each ROM bit line pair. In the case that the one line of the ROM bit line pair has decreased to approximately the ground GND level, the cross-coupled circuit 232 has the role of raising the other line of the ROM bit line pair to the power supply potential VDD level.

Figure 7:
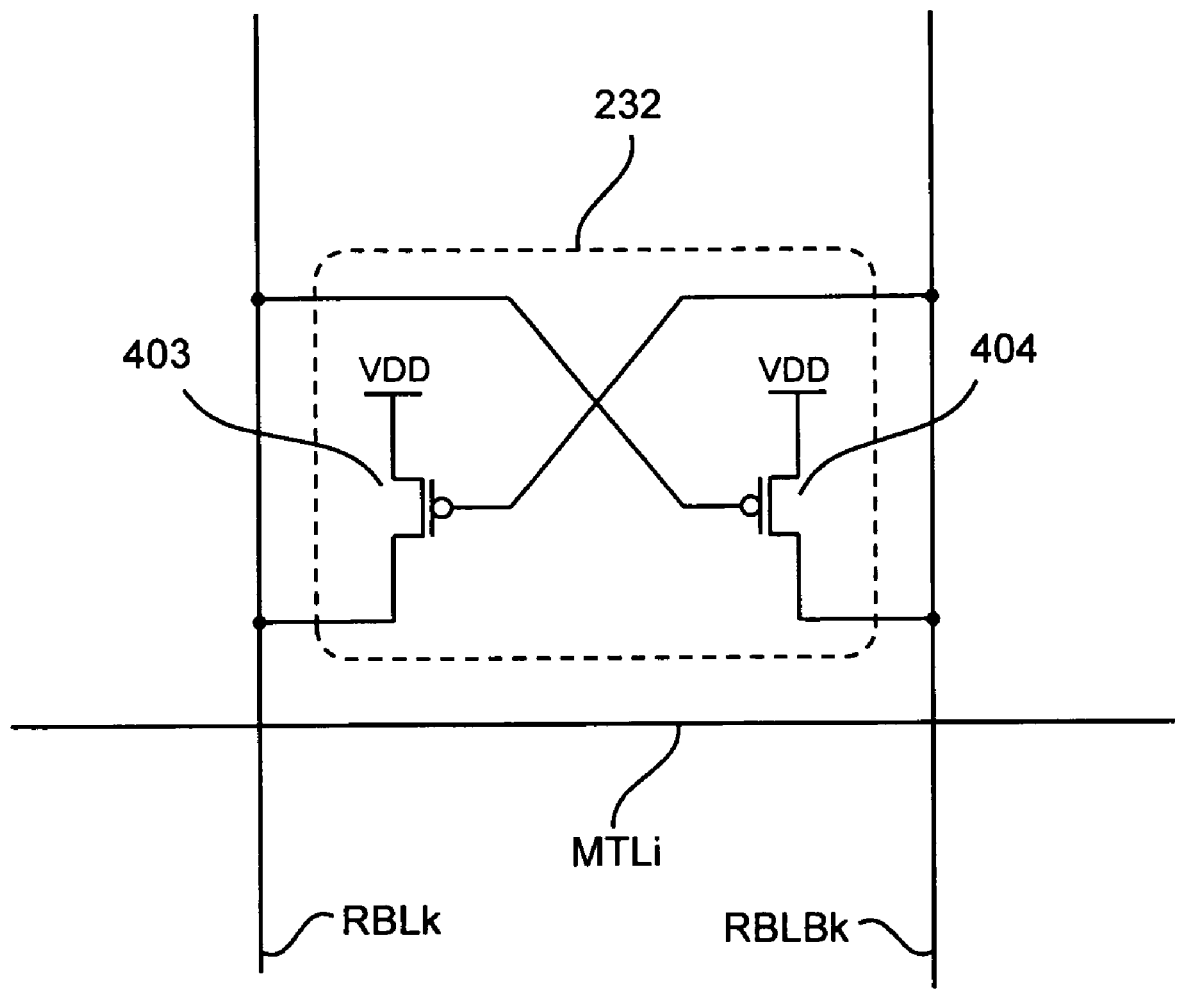
FIG. 7 is a circuit diagram of the cross-coupled circuit.
Figure 8:
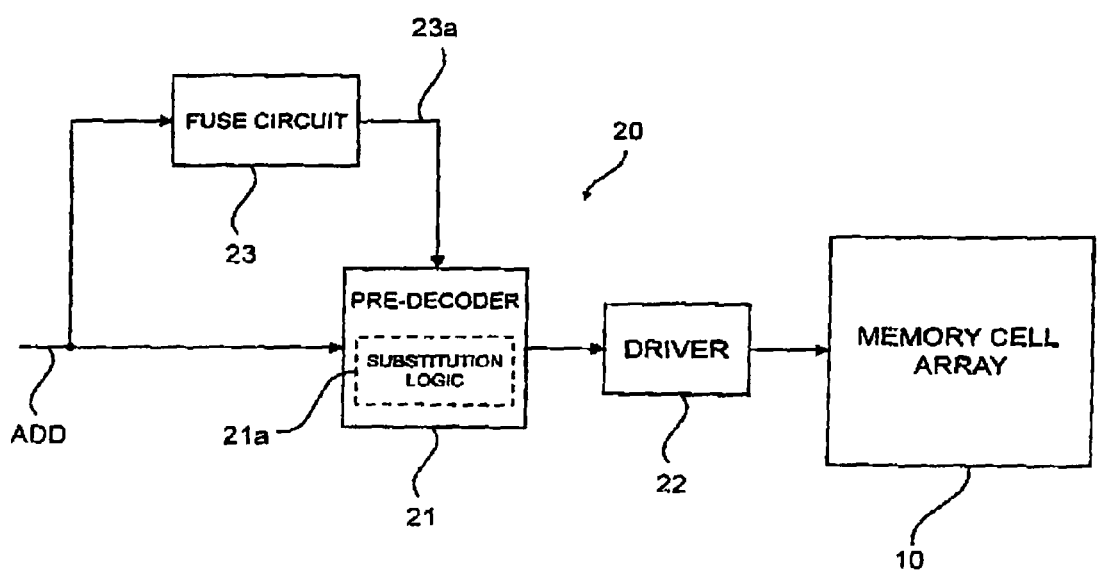
FIG. 8 is a block diagram showing the main parts of a conventional semiconductor memory device.

FIG. 7 is a circuit diagram of the cross-coupled circuit 232.

As is shown in FIG. 7, each cross-coupled circuit 232 includes a transistor 403 which is connected between the power supply potential VDD and the ROM bit line RBLk, and a transistor 404 which is connected between the power supply potential VDD and the ROM bit line RBLBk. The gate electrode of the transistor 403 is connected to the ROM bit line RBLBk, and the gate electrode of the transistor 404 is connected to the ROM bit line RBLk. These transistors 403 and 404 are both P channel MOS transistors.

As a result of such a construction, when one of the lines of the ROM bit line pair (e.g., RBLk) drops to the ground GND level, one of the cross-coupled transistors 403 or 404 (e.g., the transistor 404) is switched on. As a result, the other line of the ROM bit line pair (e.g., RBLBk) is pulled up to the power supply potential VDD level. Thus, in the present embodiment, since cross-coupled circuits 232 are connected to each of the ROM bit line pairs, complementary ROM bit line pairs can be caused to perform a full swing in spite of the fact that only N-channel MOS transistors are used as the transistors that constitute the ROM cells 231.

Furthermore, a method in which a CMOS construction is used for the ROM cells 231 is conceivable as a method for causing the complementary ROM bit line pairs to perform a full swing. In the case of this method, however, not only is the size of the ROM cells 231 increased, but also it is necessary to use complementary match lines. On the other hand, in the case of the present embodiment, there is no need to use complementary match lines; accordingly, the circuit construction can be simplified.

Since the ROM circuit 230 has the circuit configuration described above, when any one of the match signals MT0 to Mtx is activated, the respective ROM bit line pairs are driven, and the second pre-decoded address PDA2 is output. As is shown in FIG. 1, the second pre-decoded address is supplied to the multiplexer 240.

Furthermore, as is shown in FIG. 5, an enable circuit 233 is disposed in the ROM circuit 230. The enable circuit 233 is composed of enable cells 234 assigned one each to the match lines MTL0 to MTLx.

The circuit configuration of the enable cells 234 is the same as that of the ROM cells 231 shown in FIG. 6. However, in all of the enable cells 234, the transistor 401 connected to the enable bit line EBL is connected to the power supply potential VDD, and the transistor 402 connected to the enable bit line EBLB is connected to the ground GND. Accordingly, when any of the match signals MT0 to MTx is activated, the enable signal ES is in a constantly driven state. Here, the active state of the enable signal ES indicates a state in which the complementary enable signals EST and ESB are respectively at a high level and low level. As is shown in FIG. 1, the enable signal ES thus generated is supplied to the multiplexer 240.

As is shown in FIG. 5, the ROM circuit 230 further includes a second dummy circuit 235 which is connected to the dummy match line DMTL. The second dummy circuit 235 is composed of n+1 load circuits and a dummy ROM cell 237.

The load circuit 236 is a circuit which provides the same load capacity as the ROM cells 231 to the dummy match line DMTL. Accordingly, the waveform of the dummy match signal DMT inside the ROM circuit 230 matches the waveform of the activated match signals MT. Specifically, the selection timings of the ROM cells 231 and dummy ROM cell 237 are caused to match each other by the second dummy circuit 235.

The dummy ROM cell 237 has the same circuit configuration as the ROM cells 231 shown in FIG. 6, but, as in the enable cell 234, the transistor 401 connected to the timing bit line TBL is connected to the power supply potential VDD, and the transistor 402 connected to the timing bit line TBLB is connected to the ground GND. Accordingly, when the dummy match signal DMT is activated, the timing signal TS is constantly in an active state. Here, the active state of the timing signal TS indicates a state in which the complementary timing signals TST and TSB are respectively at a high level and low level.

Furthermore, as is shown in FIG. 5, the third dummy circuit 238 is disposed in the ROM circuit 230. The third dummy circuit 238 is composed of x+1 load circuits 239, and the abovementioned dummy ROM cell 237.

The load circuits 239 are circuits that provide the same load capacity as the non-selected ROM cells 231 to the timing bit lines TBL and TBLB, and do not perform the driving of the timing bit lines TBL and TBLB.

As a result of the provision of such dummy circuits 235 and 238, the dummy match signal DMT is synchronized with the activated match signals MT, and the timing signal TS is synchronized with the second pre-decoded address PDA2. As is shown in FIG. 1, the timing signal TS thus generated is supplied to the multiplexer 240.

Returning back to FIG. 1, the multiplexer 240 selects one of the pre-decoded addresses PDA1 or PDA2 on the basis of the enable signal ES. The selected pre-decoded address is supplied to the driver 250.

Specifically, in the case where the enable signal ES is in an inactive state, the multiplexer 240 selects the first pre-decoded address PDA1, which is the output of the pre-decoder 210. The inactivation of the enable signal ES results from the fact that the input address ADD does not match a defective address stored in the CAM circuit 220. In other words, in this case, since the input address ADD is a normal address, the first pre-decoded address PDA1 which indicates a normal cell is selected.

On the contrary, in cases in which the enable signal ES is in an active state, the multiplexer 240 selects the second pre-decoded address PDA2, which is the output of the ROM circuit 230. The activation of the enable signal ES results from the fact that the input address ADD matches a defective address stored in the CAM circuit 220. In other words, in this case, since the input address ADD is a defective address, the second pre-decoded address PDA2 which indicates a redundant cell is selected.

The abovementioned selection operation performed by the multiplexer 240 is performed in synchronization with the timing signal TS. As was described above, the timing signal TS is generated via the first dummy circuit 225, second dummy circuit 235, and third dummy circuit 238. Accordingly, this is synchronized with the generation timing of the second pre-decoded address PDA2. As a result, the operating timing of the multiplexer 240 can be accurately controlled.

In the semiconductor memory device of the present embodiment, as was described above, the second pre-coded address PDA2 is stored in the ROM circuit 230; accordingly, when a defective address is detected by the CAM circuit 220, it is sufficient if the second pre-decoded address PDA2 is selected by the multiplexer 240. Accordingly, there is no need to use a circuit with numerous stages as there is in the case of substituted logic. Consequently, the speed of access can be increased.

The present invention is in no way limited to the aforementioned embodiments, but rather various modifications are possible within the scope of the invention as recited in the claims, and naturally these modifications are included within the scope of the invention.

For example, the circuit configurations of the CAM circuit 220 and ROM circuit 230 shown in the abovementioned embodiment are merely examples; these circuits may have different circuit configurations. Similarly, in regard to the circuit configurations of the CAM cells and ROM cells as well, these cells may have circuit configurations that differ from those shown in the abovementioned embodiment.

Furthermore, in the abovementioned embodiment, fuse elements 301 are used as the nonvolatile memory elements contained in the CAM cells; however, the present invention is not limited to this as long as the elements used are elements that are capable of nonvolatile storage. Accordingly, elements that allow electrical rewriting, such as flash memories or anti-fuse elements, may also be used.

Furthermore, the object of the present invention is not limited to DRAM; the present invention may also be applied in other types of semiconductor memory devices.

What is claimed is:

1. A semiconductor memory device comprising:
a memory cell array including a plurality of memory cells that can be accessed by inputting an input address;
a pre-decoder that pre-decodes the input address to generate a first pre-decoded address;
a CAM circuit that activates a match signal in response to the input address indicating a defective memory cell;
a ROM circuit that outputs a second pre-decoded address and an enable signal in response to an activation of the match signal; and
a multiplexer for selecting either the first pre-decoded address or the second pre-decoded address based on the enable signal;
wherein the CAM circuit includes a match line for outputting the match signal, a plurality of CAM cells each corresponding to an associated one bit of the input address, and a pre-charging circuit for pre-charging the match line, and
the plurality of CAM cells includes a nonvolatile memory element and a discharge circuit that discharges the match line in response to a logical value stored in the nonvolatile element and a logical value of a corresponding bit of the input address being different.

2. The semiconductor memory device as claimed in claim 1, wherein
the CAM cell further includes first and second transistors and third and fourth transistors which are connected in series between the match line and a discharging line,
one of either the first or third transistor is switched on and the other is switched off based on the logical value stored in the nonvolatile memory element, and
one of either the second or fourth transistor is switched on and the other is switched off based on the logical value of the corresponding bit of the input address.

3. The semiconductor memory device as claimed in claim 1, wherein the nonvolatile memory element is a fuse element.

4. A semiconductor memory device comprising:
a memory cell array including a plurality of memory cells that can be accessed by inputting an input address;
a pre-decoder that pre-decodes the input address to generate a first pre-decoded address;
a CAM circuit that activates a match signal in response to the input address indicating a defective memory cell;
a ROM circuit that outputs a second pre-decoded address and an enable signal in response to an activation of the match signal; and a multiplexer for selecting either the first pre-decoded address or the second pre-decoded address based on the enable signal, wherein the ROM circuit includes a plurality of ROM cells each corresponding to an associated one bit of the second pre-decoded address, first and second bit lines that are connected to the ROM cells, and cross-coupled circuits that are connected to the first and second bit lines, the ROM cell includes a first transistor which is connected between the first bit line and one of either a first or a second power supply and in which the match signal is supplied to a gate electrode thereof, and a second transistor which is connected between the second bit line and the other of either the first or the second power supply and in which the match signal is supplied to a gate electrode thereof, the cross-coupled circuit includes third and fourth transistors that are cross-coupled with the first and second bit lines, and the conductivity type of the first and second transistors is different from the conductivity type of the third and fourth transistors.

5. The semiconductor memory device as claimed in claim 4, wherein the first and second transistors are N-channel-type MOS transistors, and the third and fourth transistors are P-channel-type MOS transistors.

6. The semiconductor memory device as claimed in claim 4, wherein the ROM circuit further includes an enable cell that is selected using the match signal, and an enable bit line that is connected to the enable cell, and an output of the enable bit line is supplied to the multiplexer as the enable signal.

7. The semiconductor memory device as claimed in claim 4, wherein the CAM circuit further includes a dummy match line for outputting a dummy match signal that is activated regardless of a value of the input address signal, the ROM circuit further includes a dummy ROM cell that is selected by the dummy match signal, and a timing bit line that is connected to the dummy ROM cell, an output of the timing bit line is supplied to the multiplexer as a timing signal, and an operation of the multiplexer is controlled by the timing signal.

8. The semiconductor memory device as claimed in claim 7, wherein the CAM circuit further includes a first dummy circuit which is connected to the dummy match line, and that matches an activation timing of the match signal to an activation timing of the dummy match signal, and the ROM circuit further includes a second dummy circuit which is connected to the dummy match line, and that matches an selection timing of the ROM cell to an selection timing of the dummy ROM cell, and a third dummy circuit which is connected to the timing bit line, and that matches an activation timing of the second pre-decoded address to an activation timing of the timing signal.

9. The semiconductor memory device as claimed in claim 1, wherein the nonvolatile memory element comprises a fuse element, wherein the plurality of CAM cells further include:
a latch circuit connected to the fuse element;
a first pair of transistors connected in series between the match line and an electric potential, and including a first transistor having a gate connected to a first search bit line and a second transistor having a gate connected to a first output terminal of the latch circuit; and a second pair of transistors connected in series between the match line and an electric potential, and including a first transistor having a gate connected to a second search bit line and a second transistor having a gate connected to a second output terminal of the latch circuit, and wherein the first output terminal of the latch circuit is connected to the fuse element and the second output terminal of the latch circuit is connected to an initializing transistor.

10. The semiconductor memory device as claimed in claim 4, wherein the CAM circuit comprises a nonvolatile memory element and a match line for outputting a match signal, the CAM circuit discharging the match line based on whether a value stored in the nonvolatile memory element matches a value of the input address.

11. The semiconductor memory device as claimed in claim 10, wherein the CAM circuit discharges the match line if the value stored in the nonvolatile memory element does not match the value of the input address.

12. The semiconductor memory device as claimed in claim 10, wherein the CAM circuit includes a plurality of CAM cells each corresponding to an associated one bit of the input address, and a pre-charging circuit for pre-charging the match line.

13. The semiconductor memory device as claimed in claim 10, wherein the CAM circuit includes a discharge circuit that discharges the match line in response to a logical value stored in the nonvolatile element and a logical value of a corresponding bit of the input address being different.

14. The semiconductor memory device as claimed in claim 10, wherein the nonvolatile memory element comprises a fuse element, wherein the CAM circuit further comprises a plurality of CAM cells including:
the fuse element;
a latch circuit connected to the fuse element;
a first pair of transistors connected in series between the match line and an electric potential, and including a first transistor having a gate connected to a first search bit line and a second transistor having a gate connected to a first output terminal of the latch circuit; and a second pair of transistors connected in series between the match line and an electric potential, and including a first transistor having a gate connected to a second search bit line and a second transistor having a gate connected to a second output terminal of the latch circuit, and wherein the first output terminal of the latch circuit is connected to the fuse element and the second output terminal of the latch circuit is connected to an initializing transistor.

* * * * *